(12) United States Patent
Mehta et al.

(10) Patent No.: US 7,838,370 B2
(45) Date of Patent: Nov. 23, 2010

(54) HIGHLY SELECTIVE LINERS FOR SEMICONDUCTOR FABRICATION

(75) Inventors: Narendra Singh Mehta, Dallas, TX (US); Wayne Anthony Bather, Silver Springs, MD (US); Ajith Varghese, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 176 days.

(21) Appl. No.: 11/965,633

(22) Filed: Dec. 27, 2007

(65) Prior Publication Data

US 2008/0217703 A1    Sep. 11, 2008

Related U.S. Application Data

(60) Provisional application No. 60/877,302, filed on Dec. 27, 2006.

(51) Int. Cl.
*H01L 21/336* (2006.01)
*H01L 21/76* (2006.01)

(52) U.S. Cl. .............. 438/296; 438/425; 257/E21.409; 257/E21.545; 257/E23.002; 257/E29.255

(58) Field of Classification Search .................. 438/425, 438/296; 257/E21.545, E21.409, E23.002, 257/E29.409
See application file for complete search history.

(56) References Cited

U.S. PATENT DOCUMENTS 5,677,231 A * 10/1997 Maniar et al. ............... 438/221

* cited by examiner

*Primary Examiner*—David S Blum
(74) *Attorney, Agent, or Firm*—Warren L. Franz; Wade J. Brady, III; Frederick J. Telecky, Jr.

(57) ABSTRACT

A method for manufacturing an isolation structure is disclosed that protects the isolation structure during etching of a dichlorosilane (DCS) nitride layer. The method involves the formation of a bis-(t-butylamino)silane-based nitride liner layer within the isolation trench, which exhibits a five-fold greater resistance to nitride etching solutions as compared with DCS nitride, thereby allowing protection against damage from unintended over-etching. The bis-(t-butylamino) silane-based nitride layer also exerts a greater tensile strain on moat regions that results in heightened carrier mobility of active regions, thereby increasing the performance of NMOS transistors embedded therein.

20 Claims, 7 Drawing Sheets

HIGHLY SELECTIVE LINERS FOR SEMICONDUCTOR FABRICATION

CROSS REFERENCE TO RELATED APPLICATIONS

This patent application claims the benefit for priority under 35 U.S.C. 119(e) of U.S. Provisional Patent Application No. 60/877,302 ("Highly Selective Liners for Semiconductor Fabrication"), filed on Dec. 27, 2006, which is incorporated by reference as if fully rewritten herein.

FIELD

The present disclosure relates generally to the fabrication of semiconductor devices, and more particularly to materials used as liners in the process of manufacturing semiconductor devices.

BACKGROUND

Integrated semiconductor circuits are built through a very intricate process of creating and interconnecting, on a silicon wafer, a plurality of devices comprised of layers of chemicals with various electromechanical properties. The steps for producing such devices are discussed herein as background for the discussion of the invention.

The process begins with a silicon wafer and the designation of doped moat areas, where NMOS and PMOS devices are to be created. The moat regions that will support PMOS devices are n-doped, and the moat regions that will support NMOS devices are p-doped. NMOS and PMOS regions must be electrically isolated in order to prevent unintended conductivity. This isolation is implemented by forming an isolation structure between these regions, comprising a trench etched between the regions and filled with a dielectric material.

Following formation of the isolation trench, a layer of controllably conductive material is selectively deposited to form the gate regions of transistors in each moat, where each gate connects two active transistor areas. These active transistor areas are doped accordingly: the active transistor areas of NMOS devices are n-doped, and the active transistor areas of PMOS devices are p-doped, such that the active transistor areas are isolated by the inversely doped moat region.

Finally, a layer of dielectric is deposited atop the wafer and manufactured devices in order to protect and electrically insulate the devices. Contact vias are selectively etched through the dielectric material in order to provide access to each gate and active transistor area; these contact vias are filled with one or more conductive metals, and the surface contact points for each metallized contact via are interconnected to produce a fully interconnected integrated circuit.

Several steps in this process involve the formation of a layer only in desired regions of the semiconductor. Selective deposition involves the deposition of the layer material across the entire surface of the semiconductor, followed by the selective removal of the layer material from undesired regions. This selective removal is often performed by a photolithography process. This process begins by forming a layer of photoresist material, which is sensitive to ultraviolet light, atop the layer to be selectively removed. A photolithography mask is prepared, which contains a series of transparent regions corresponding to regions of undesired material, and opaque regions corresponding to regions of desired material. This photolithography mask is positioned over the photoresist layer, and ultraviolet light is directed toward the photolithography mask, such that the exposed regions of photoresist are selectively softened. The semiconductor is then exposed to a developer solution that selectively washes away the softened photoresist material, while leaving behind the unsoftened photoresist regions. This process selectively exposes regions of the underlying layer, which can be selectively removed by exposing the semiconductor to an etching solution that is chemically selective for the material of the underlying layer. Finally, the remaining photoresist material is removed, usually by an ashing process. The result of this photolithography process is a selectively deposited layer upon the semiconductor.

A common problem with this selective deposition technique is the risk of unintentionally etching the materials and layers underneath the layer that is being selectively etched. This may occur if the underlying material is sensitive to the etching solution used for etching the selectively deposited layer atop it; in this case, the underlying layer may be unintentionally etched during the etching step. Accordingly, prior to forming any layer that is to be selectively deposited, it is often advantageous to form an "etch-stop" layer that is less sensitive to the etching solution than the material of the selectively deposited layer. This etch-stop layer protects the underlying materials from unintended exposure to the etch solution, while permitting a completion of the etching of the selectively deposited layer. In many cases, the fabrication process may intentionally expose the selectively deposited layer to etching solution for longer than necessary, in order to guarantee full etching of all undesired areas of this layer across the entire semiconductor surface. This "over-etching" step is only feasible because the comparative insensitivity of the etch-stop layer to the etching solution protects the underlying materials from unintended exposure to the etching solution.

In some instances, multiple etch-stop layers are required to protect against unintended etching during multiple etching steps. One example where multiple etch-stop layers are required is during the formation of the isolation trench. The isolation trench is formed in several steps, which are illustrated in FIGS. 1A-1G.

Figure 1A:
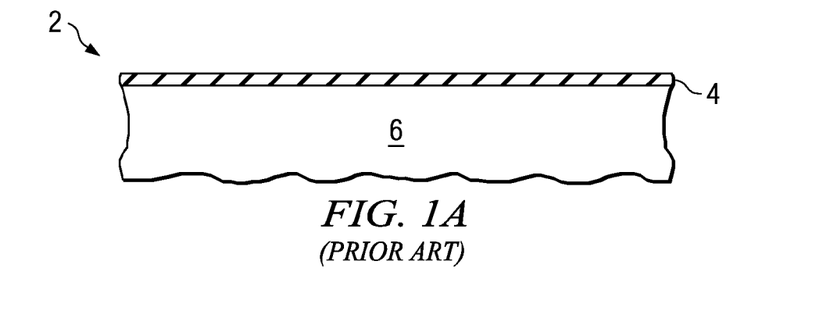
FIGS. 1A-1G are partial side elevation views in section illustrating a portion of a conventional shallow trench isolation process for providing isolation between adjacent electrical devices in a semiconductor wafer.
Figure 1B:
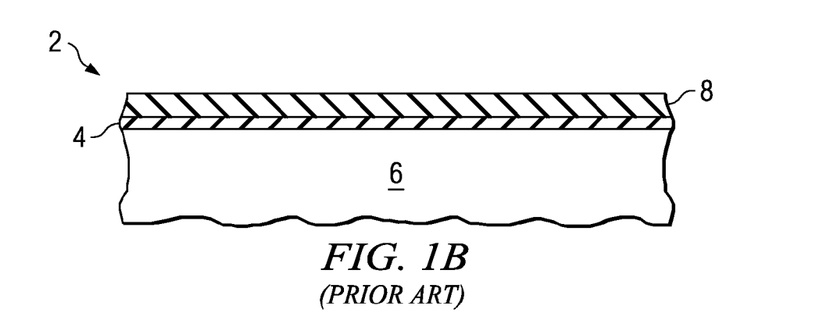
Figure 1C:
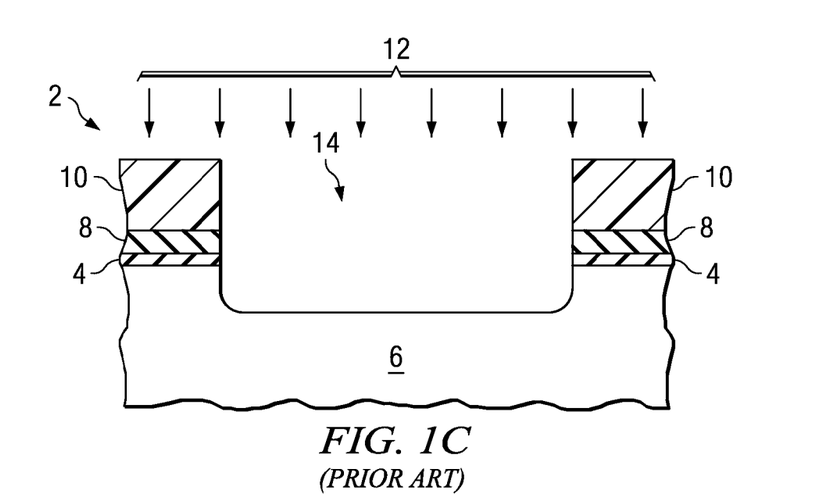

The process begins with the provision of a silicon wafer 2. In the first step, shown in FIG. 1A, an oxide liner layer 4 is formed atop the silicon substrate 6; this is often performed by exposing the silicon to heat and oxygen, thereby creating a silicon oxide layer across the entire silicon wafer. Next, as shown in FIG. 1B, an active region liner layer 8 is deposited atop the silicon oxide layer 4, which serves as a second liner layer. A common choice of material for this layer is dichlorosilane (DCS) nitride, which may be deposited by chemical vapor deposition (CVD), sputtering, etc. In the third step, shown in FIG. 1C, the active region liner layer 8, oxide liner layer 4, and silicon substrate 6 are selectively removed from the area where an isolation trench is to be formed 14. This selective removal is performed by forming a photoresist layer 10 atop the active region liner layer 8; selectively softening the photoresist layer atop the isolation trench area 14 through the use of a photolithography mask and exposure of undesired regions to ultraviolet light (not shown); and selectively removing the softened photoresist material via a developer solution (not shown). The result of this step is the selective exposure of the active region liner layer 8, silicon oxide 4, and silicon substrate 6 in the isolation area. Subsequent exposure of the semiconductor 2 to a trench etch solution 12 removes these materials in the isolation area, thereby creating an isolation trench 14.

Figure 1D:
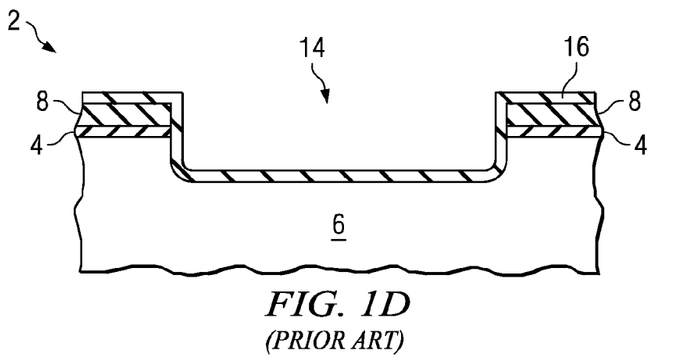

In the next step, shown in FIG. 1D, the remaining photoresist material 10 is removed via ashing, and the isolation trench 14 is lined with a trench liner layer 16. The material conventionally chosen for the trench liner layer 16 is the same DCS nitride that comprises the active region liner 8.

Figure 1E:
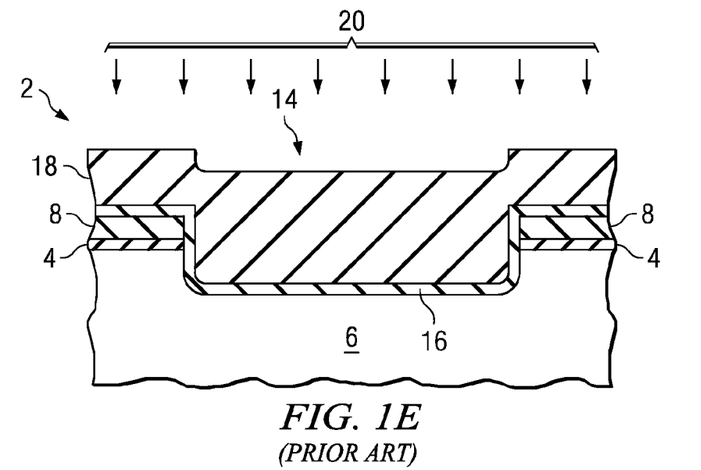

In the next step, shown in FIG. 1E, a layer of dielectric material 18 is formed over the surface of the semiconductor 2, including within the isolation trench 14. In the next step, shown in FIG. 1F, the semiconductor 2 is subjected to a planarization process 22, such as chemical mechanical polishing (CMP), to remove the upper layers of the semiconductor. In the active region, this planarization 22 removes both the dielectric material 18 and the trench liner layer 16, thereby exposing the active region liner layer 8 formed on the silicon oxide liner 4. In the isolation trench 14, this planing 22 leaves behind the dielectric material 18 and the trench liner layer 16.

Figure 1F:
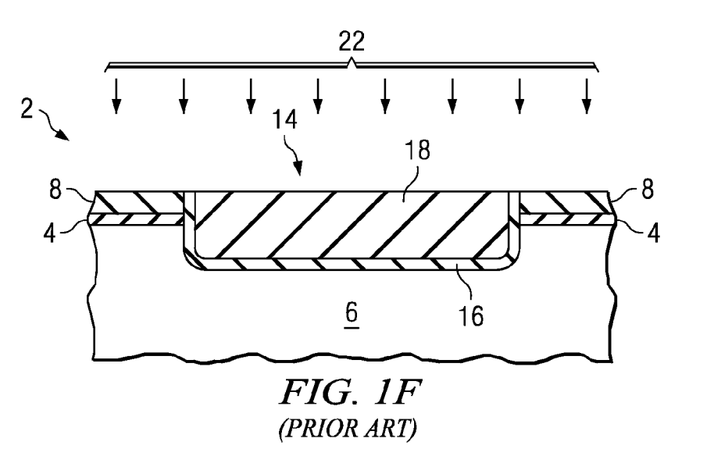
Figure 1G:
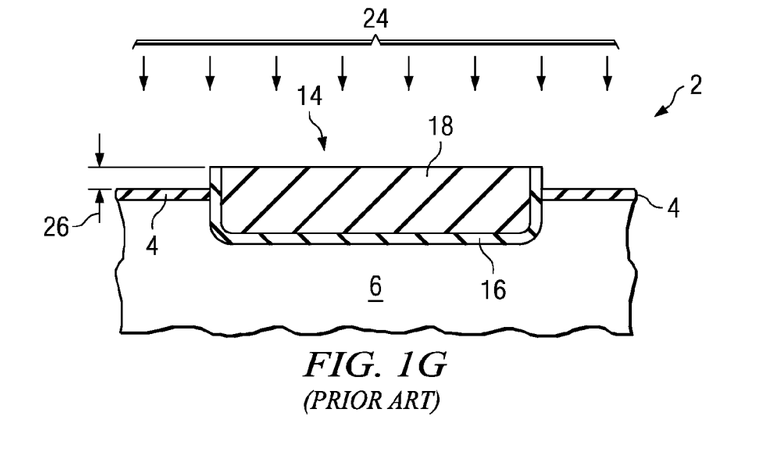

In the next step, shown in FIG. 1F, the semiconductor 2 is exposed to an etching solution that is specific to the material comprising the active region liner 8. Hot phosphoric acid is often chosen as the etch solution in this step due to its high selectivity for DCS nitride. During the nitride layer etch 22, the DCS nitride 8 is removed from the active region, while the trench is protected from etching by the dielectric material 18. The resulting semiconductor substrate presents active regions coated with silicon oxide 4, separated from adjacent active regions by an isolation trench 14 filled with dielectric material 18.

An additional feature of transistors manufactured in this manner is related to the performance of transistors. An additional and desirable property of such transistors is mechanical stress, in the form of tensile or compressive strain, which increases the mobility of the carrier (electrons or electron deficits) through the transistor. This increased carrier mobility may translate to faster switching speeds of the transistor and/or operation at lower voltages. For NMOS devices embedded in an active region, the effect is optimal if a tensile stress is exerted on the active region.

Contemporary methods incorporate this feature by including a nitride film layer in the isolation trench. Prior to the deposition of dielectric material in the isolation trench, a nitride layer is deposited within the isolation channel. The nitride layer may be formed by any appropriate method, e.g., chemical vapor deposition (CVD) or sputter deposition. Subsequent thermal processing of this layer creates a tensile strain on the moat in the range of 400-600 MPa. However, a greater tensile strain would further improve the performance of the transistor.

It is always desirable to make further improvements in isolation structures and fabrication techniques.

SUMMARY

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The invention relates to an isolation structure for isolating active regions on a semiconductor device and related fabrication methods. In one aspect of the invention, the isolation structure described herein differs from conventional isolation structures by the use of a trench liner material that exhibits a comparative resistance to the etch solution that is used to remove the planarization stop used on the active region. This comparative resistance results in a slower rate of etching of the trench liner material than of the active region planarization stop material, thereby allowing greater protection against accidental etching into and damage of the isolation trench. If the etch rate difference is sufficiently large, then the fabrication process may expressly "over-etch" the semiconductor by exposing it to the etch solution for a protracted period of time in order to ensure the complete removal of the active region planarization stop, while relying on the greater resistance of the trench liner material to protect the isolation trench. Thus, this aspect of the invention provides more precise control over the fabrication process and results in a higher manufacturing quality standard for semiconductor devices.

In another aspect of the invention, the isolation structure described herein exerts a greater tensile strain on the active regions that may improve performance in NMOS devices formed upon an active region. As discussed hereinabove, conventional trench liners are known to exert a tensile stress of 400-600 MPa on the active regions of the semiconductor. Other materials are known to exhibit a greater tensile strain if deposited in the isolation trench, which provides for enhanced carrier mobility and a higher-performance transistor.

One material that may be used to achieve these effects is a bis(t-butylamino)silane-based (BTBAS) nitride. With respect to hot phosphoric acid, which is a common etch solution that is employed to remove the DCS nitride used as the planarization stop, BTBAS nitride exhibits an etch rate that is five times slower than DCS nitride. Additionally, when used as a trench liner, BTBAS nitride exerts a tensile strain on the adjacent active region of 1.2 GPa, which outperforms the 400-600 MPa tensile strain exertion of DCS nitride when used in the context.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Figure 2A:
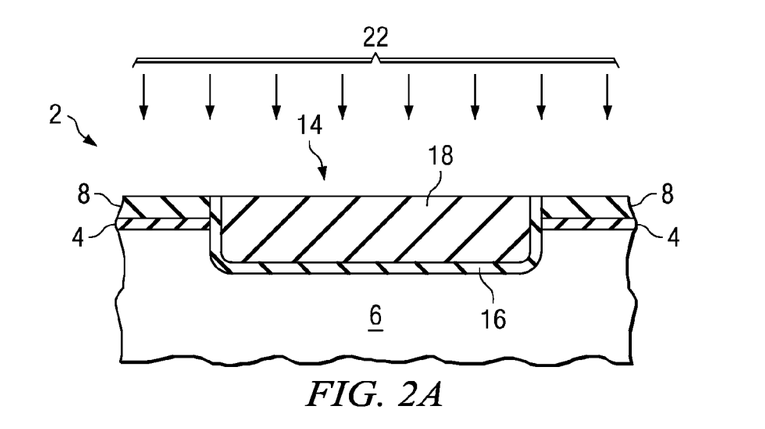
FIGS. 2A-2B are a side elevation views in section illustrating an exemplary isolation structure created according to one or more aspects of the present invention.
Figure 2B:
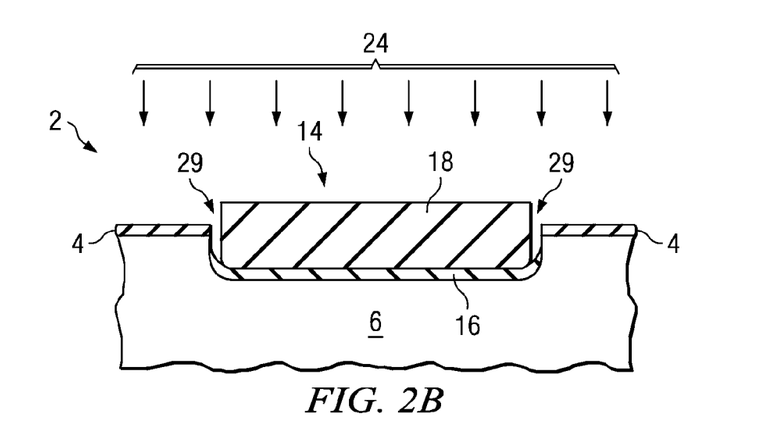

The inventors of the present invention discovered a problem associated with conventional trench isolation processing. More particularly, it was discovered that during the removal of the nitride that serves as the planarization stop over the active region, the liner nitride within the trench would become damaged in some instances. For example, as illustrated in FIG. 2A, after a dielectric fill material 18 is planarized, for example, via CMP 22, the planarization stops of the DCS nitride film 8 that serves as a stop for the planarization operation. Subsequently, the DCS nitride 8 is removed, for example, via a wet etch 24 such as hot phosphoric acid. As can be seen in FIG. 2B, since the trench liner 16 is also formed of DCS nitride, the wet etch 24 is not selective thereto, and the operation causes damage and/or removal of a portion of the DCS liner nitride, as designated at reference numeral 29. Therefore it was appreciated by the inventors of the present invention that the material employed for the trench liner should be different than the material employed as the planarization stop over the active areas.

Figure 3:
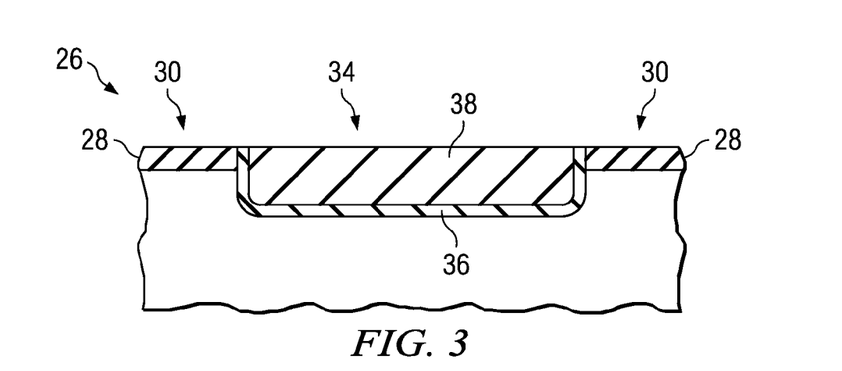
FIG. 3 is a side elevation view in section illustrating another exemplary isolation structure created according to one or more aspects of the present invention.

FIG. 3 illustrates an exemplary isolation structure formed on a semiconductor substrate in accordance with one aspect or embodiment of the present invention. It will be appreciated that the isolation trench 34 serves to electrically isolate active regions 30 of the substrate 26 from one another, where semiconductor devices, such as MOS transistors, for example, can be formed in the active regions 30. The semiconductor substrate 26 may comprise any type of semiconductor body, such as a semiconductor wafer, as well as any other type of semiconductor layers associated therewith. Further, the substrate 26 may comprise silicon and/or silicon germanium, for example.

As described hereinabove, the patterning of isolation trenches sometimes employs the formation of an active region mask layer, and is later removed through the use of an active region mask etching solution. FIG. 3 reflects illustrates this active region mask layer 28 as deposited on an active region 30 on a semiconductor 26. Once an isolation trench 34 has been etched between the active regions 30 of the semiconductor 26, the isolation structure may be created by forming a trench liner layer 36 that is comparatively resistant to the active region mask etching solution, and then depositing a dielectric material 38 within the isolation trench atop the trench liner layer 34. The structure so devised operates to isolate the active regions 30. In accordance with the present invention, forming the trench liner layer 36 with a material that exhibits a comparative resistance to the active region mask etching solution that is used to remove the active region mask 28 provides more precise control over the fabrication process and results in a higher manufacturing quality standard for semiconductor devices, as will be more fully appreciated infra.

As an example of the isolation structure illustrated in FIG. 3, the active region mask (which also serves as a planarization stop) 28 may be primarily comprised of dichlorosilane (DCS) nitride, which is the commonly chosen material for this layer, and the trench liner layer 36 may be primarily comprised of a bis(t-butylamino)based (BTBAS) nitride. The trench liner layer may be formed via any suitable method, including chemical vapor deposition of a bis(t-butylamino)silane-based nitride gas, and/or by sputter deposition of a bis(t-butylamino)silane-based nitride within the isolation trench.

Figure 4:
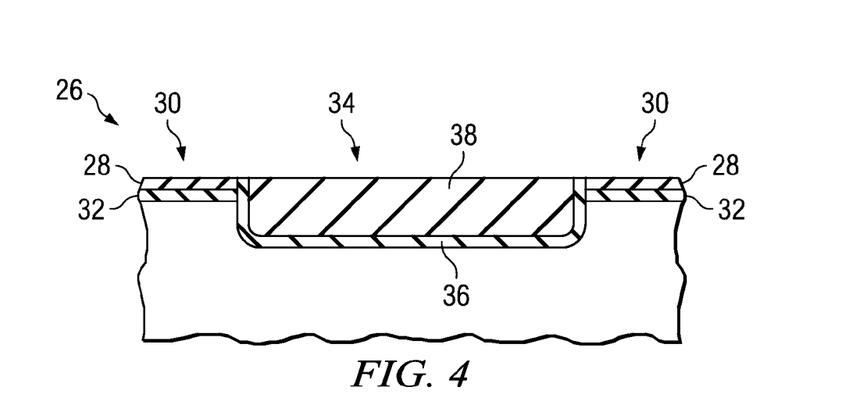
FIG. 4 is a side elevation view in section illustrating yet another exemplary isolation structure created according to one or more aspects of the present invention.

FIG. 4 illustrates another exemplary isolation structure formed on a semiconductor substrate in accordance with the present invention. Similar to the isolation structure illustrated in FIG. 3, the isolation structure of FIG. 4 requires the etching of an isolation trench 34 between the active regions 30 of the semiconductor 26, and may then be created by forming a trench liner layer 36 that is comparatively resistant to the active region mask etching solution, and then depositing a dielectric material 38 within the isolation trench atop the trench liner layer 36. In addition to these devices, between the active region 30 and the first active region liner layer 28 is a second active region stop layer 32, which is often included to serve as an etch-stop layer during the removal of the first active region mask 28 from the active region 30. It will be appreciated from the illustration that the inclusion of a second active region stop layer 32 is neither detrimental to nor redundant with the function of the trench liner layer 36 for the protection of the isolation trench 34 during the removal of the first active region mask layer 28.

Figure 5:
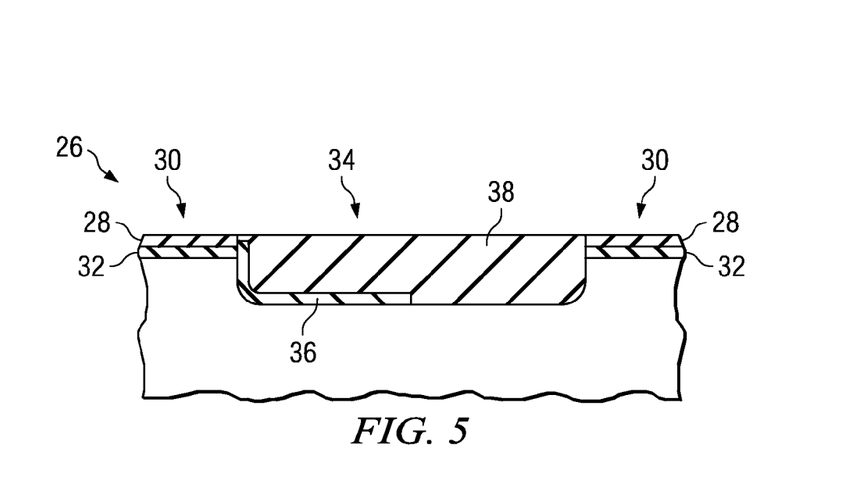
FIG. 5 is a side elevation view in section illustrating yet another exemplary isolation structure created according to one or more aspects of the present invention.

FIG. 5 illustrates yet another exemplary isolation structure formed on a semiconductor substrate in accordance with the present invention. As noted above, the trench liner layer 36 may serve to impose a mechanical strain on the active region 30 adjacent to the isolation trench 34, because mechanical strain is known to enhance the performance of devices that may be formed upon the active region 30. As further noted above, tensile strain exerted in this manner more strongly enhances the performance of NMOS devices than of PMOS devices. Accordingly, for instance, where the mechanical strain imposed by the trench liner layer is tensile strain, and where an isolation trench separates an active region containing NMOS devices from an active region containing PMOS devices, it may be desirable to substantially limit the exerted tensile strain to the former active region. An exemplary isolation structure that features such a limitation is shown in FIG. 5, which is very similar to the isolation structure of FIG. 4, with the noteworthy distinction that the trench liner layer 36 has been selectively removed from a portion of the isolation trench 34. It will be appreciated that this selective removal of the trench liner layer 36 from a portion of the isolation trench 34 is not detrimental to its function for exertion of tensile stain on an active region 30 where such tensile strain is desired. Another exemplary isolation structure, not shown, may additionally include the deposition of a second trench liner layer in the portion of the isolation trench where the first trench liner layer was removed, where the second trench liner layer is comprised of a material that is also comparatively resistant to the active region liner etch solution, but that exerts a compressive strain, rather than tensile strain, on the adjacent active region.

FIGS. 6 and 7A-7F illustrate a method of forming an isolation structure in accordance with one embodiment of the present invention. Although the methodologies are illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 6:
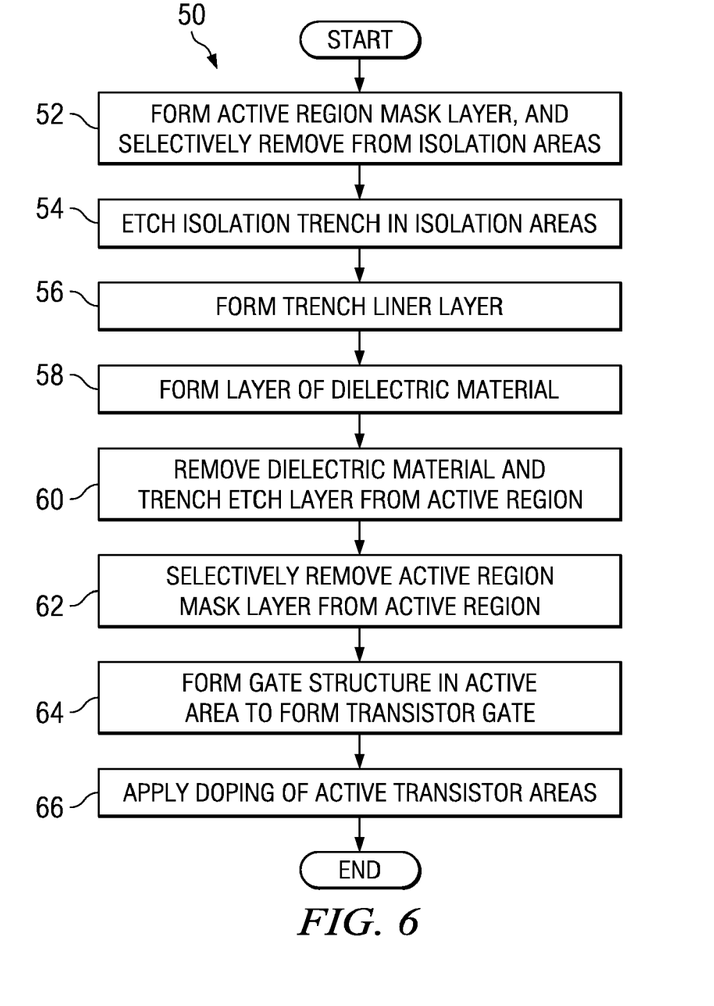
FIG. 6 is a flow diagram illustrating an exemplary method of forming an isolation structure on a semiconductor substrate according to one or more aspects of the present invention.
Figure 7A:
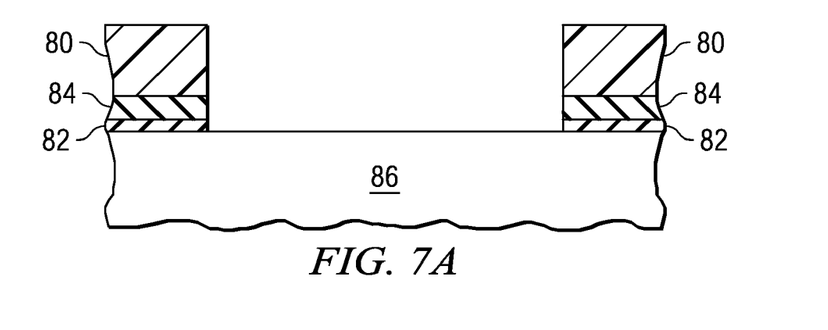
FIGS. 7A-7F are side elevation views in section illustrating the formation of an isolation structure according to one or more aspects of the present invention.

FIG. 6 illustrates a method 50 of forming a transistor on a first active region of a semiconductor that is electrically isolated from a second active region of the semiconductor by an isolation structure. The method begins at 52 with the formation of an active region mask layer (that serves as a planarization stop) on the surface of the semiconductor substrate, and the selective removal of the active region mask layer from the isolation area, where an isolation trench is to be formed between the first active region and the second active region. One example of 52 is illustrated in FIG. 7A, wherein a photoresist 80 is patterned to expose an underlying active region mask layer 82, 84. The photoresist 80 is employed as a mask to etch away the mask layer 82, 84 (which in this exemplary embodiment is a bi-layer), and expose the underlying semiconductor body 86.

Figure 7B:
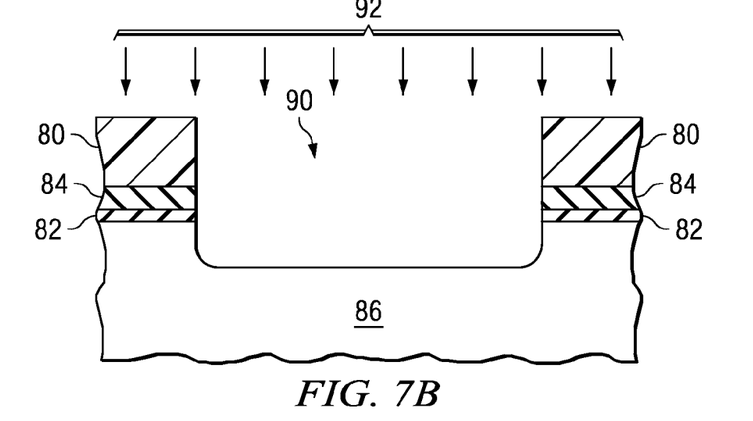
Figure 7C:
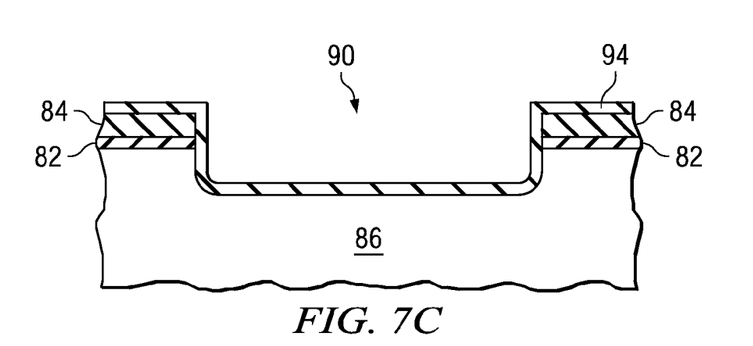

Next, an isolation trench 90 is etched 92 in the isolation area at 54, as illustrated in FIG. 7B. A trench liner layer 94 is then formed in the isolation trench 90 at 56, as illustrated in FIG. 7C, where the trench liner layer is primarily comprised of a material that is comparatively resistant to the etch solution that will be used subsequently to remove at least a portion of the active region mask layer 84. For example, in one embodiment of the invention, the mask layer 84 comprises a DCS nitride, and the trench liner layer 94 comprises a BTBAS nitride layer. As will be discussed in greater detail below, the etch rate of the BTBAS nitride layer 94 is about one-fifth the etch rate of the DCS nitride layer 84, and consequently, the removal of the mask layer 84 does not substantially affect the trench liner layer 94. While the above materials and etch rates are provided in one example, it should be understood that alternatives may be employed and such alternatives are contemplated as falling within the scope of the present invention.

Figure 7D:
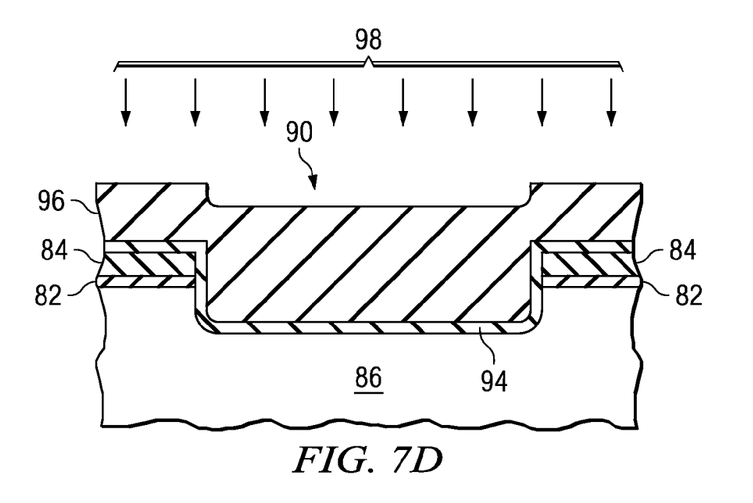
Figure 7E:
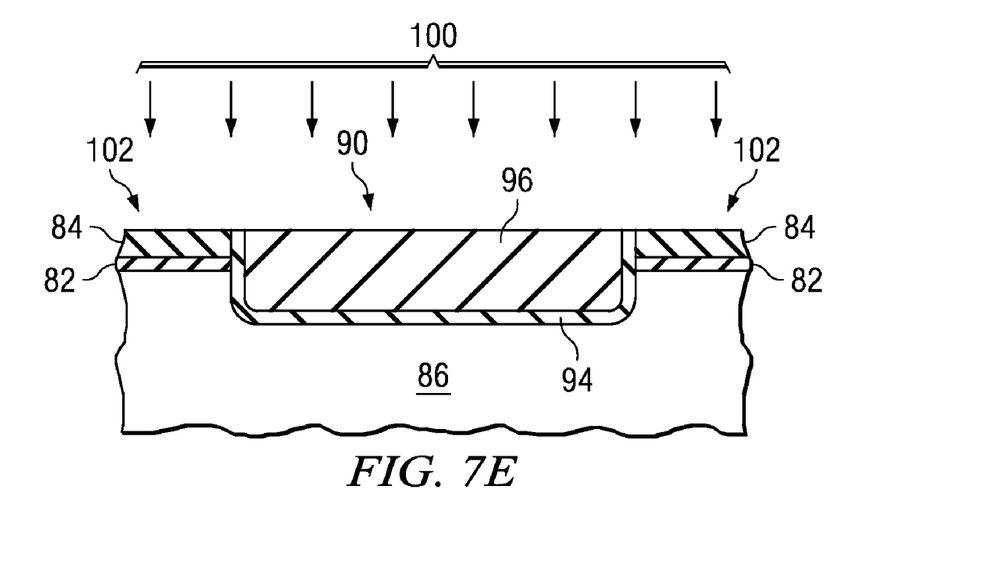
Figure 7F:
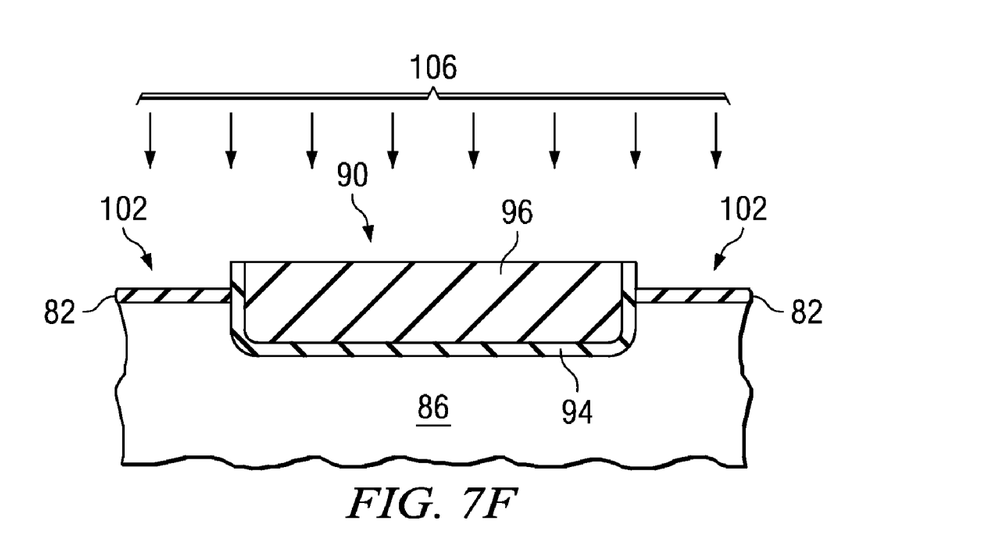

A layer of dielectric material 96 is formed on the surface of the semiconductor 58, and fills the isolation trench 90 via a deposition process 98, as illustrated in FIG. 7D. The semiconductor is then subjected to a planarization process 100, such as chemical mechanical polishing (CMP), in order to remove the top surface layers across the surface of the semiconductor 60, using the mask layer 84 as a planarization stop, as illustrated in FIG. 7E. In the active region 102, this planarization 100 removes both the dielectric material and the trench liner layer, thereby exposing the active region mask layer 84. In the isolation trench 90, this planarization 100 leaves behind the dielectric material 96 and the trench liner layer 94. The semiconductor is then exposed to an active region etching process, such as a wet etchant 106, which selectively removes the exposed active region mask layer 84 from the active regions 102.

A gate structure is then formed in an active area at 64 of FIG. 6, and is patterned to form a gate electrode for a transistor device. A doping process is then employed, such as ion implantation, in order to dope the source/drain regions in the active area adjacent the gate electrode to form a transistor device at 66. This method results in the fabrication of a transistor on an active region of a semiconductor that is electrically isolated from other active regions of the semiconductor by an isolation structure according to the invention.

As with the other methods described above, the method 50 of FIG. 6 may be varied or improved in several ways in accordance with alternative embodiments of the invention. As one example, the trench liner layer 94 may be heated to exert a mechanical strain on the active regions 102 adjacent to the isolation trench 90. If desired, the mechanical strain so imposed may be limited to selected active regions by selectively removing the trench liner layer from a portion of the isolation trench. The method of FIG. 6 may also be varied by forming a second active region liner layer prior to forming the first active region liner layer. This second active region liner layer is neither detrimental to nor redundant with the function of the trench liner layer for the protection of the isolation trench during the removal of the first active region liner layer.

One implementation of this method that features the advantages described above involves the use of a bis(t-butylamino) silane-based (BTBAS) nitride for the trench liner layer, and dichlorosilane (DCS) nitride for the active region mask layer. As noted above, with respect to hot phosphoric acid, which is a common etch solution that is selective for DCS nitride, BTBAS nitride exhibits an etch rate that is five times slower than DCS nitride. Additionally, when used as a trench liner, BTBAS nitride exerts a tensile strain on the adjacent active region of 1.2 GPa, which outperforms the 400-600 MPa tensile strain exertion of conventional DCS nitride trench liners when used in the context. Alternatively or additionally, the second active region liner layer may be comprised of silicon oxide, which may be created by exposing the semiconductor substrate to an oxidative process.

It will be appreciated that the steps of this method shown in FIG. 6 may be performed, and the isolation structure shown in FIGS. 3-5 and 7A-7F, may be formed using any suitable technique selected from the several alternative techniques known to those of ordinary skill in the art of semiconductor fabrication. For instance, the isolation channels can be formed in the substrate in any suitable manner, such as with lithographic techniques, for example, where lithography broadly refers to processes for transferring one or more patterns between various media. In lithography, a light sensitive resist coating (not shown) is formed over one or more layers to which a pattern is to be transferred (e.g., the substrate). The resist coating is then patterned by exposing it to one or more types of radiation or light which (selectively) passes through an intervening lithography mask containing the pattern. The light causes the exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched) to transfer the pattern thereto.

It will be appreciated that while reference is made throughout this document to exemplary structures in discussing aspects of methodologies described herein, those methodologies are not to be limited by the corresponding structures presented. Rather, the methodologies (and structures) are to be considered independent of one another and able to stand alone and be practiced without regard to any of the particular aspects depicted in the Figs.

It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

Additionally, it will be appreciated that the ordering of the acts or events of the methods described herein can also be altered. For example, NMOS doping may occur at one of several points in this method; as long as the resulting transistor forms a controllably conductive gate between two NMOS active transistor areas in a PMOS active region, the resulting transistor will operate as intended.

Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as atomic layer deposition (ALD), chemical vapor deposition (CVD), physical vapor deposition (PVD), atmospheric pressure CVD (APCVD), low pressure CVD (LPCVD), metal-organic CVD (MOCVD) and/or plasma enhanced CVD (PECVD), for example, and can be patterned in any suitable manner (unless specifically indicated otherwise), such as via etching and/or lithographic techniques, for example.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A method of forming an isolation structure in a semiconductor substrate adjacent to an active region of the semiconductor substrate, wherein the active region of the semiconductor substrate is formed with a first active region liner comprising material that is sensitive to a first active region liner etching solution, the method comprising:
   forming an isolation trench;
   forming a trench liner layer within the isolation trench, wherein the trench liner layer is comparatively resistant to the active region liner etching solution; and
   filling the isolation trench with dielectric material atop the trench liner layer;
   wherein the trench liner comprises bis(t-butylamino)-based nitride.

2. The method of claim 1, wherein the first active region liner is primarily comprised of dichlorosilane nitride.

3. The method of claim 1, wherein the trench liner layer exerts tensile strain upon the active regions adjacent to the isolation trench, and further comprising heating the trench liner layer in order to impose the tensile strain on the active regions adjacent to the isolation trench.

4. The method of claim 1, further comprising, prior to forming the first active region liner, forming a second active region liner layer on the active regions that is comparatively resistant to the first active region liner etching solution.

5. The method of claim 4, wherein the second active region liner layer is comprised of a silicon oxide.

6. The method of claim 4, wherein the second active region liner layer is formed by exposing the semiconductor substrate to an oxidative process.

7. A method of forming an isolation structure in a semiconductor substrate adjacent to an active region of the semiconductor substrate, wherein the active region of the semiconductor substrate is formed with a first active region liner comprising material that is sensitive to a first active region liner etching solution, the method comprising:
   forming an isolation trench;
   forming a trench liner layer within the isolation trench, wherein the trench liner layer is comparatively resistant to the active region liner etching solution; and
   filling the isolation trench with dielectric material atop the trench liner layer;
   wherein the trench liner layer exerts tensile strain upon the active regions adjacent to the isolation trench, and the trench liner layer is selectively removed from a portion of the isolation trench adjacent to an active region for PMOS transistors, whereby the tensile strain exerted by the trench liner layer is limited to an active region for NMOS transistors adjacent to the isolation trench.

8. The method of claim 7, further comprising, prior to forming the first active region liner, forming a second active region liner layer on the active regions that is comparatively resistant to the first active region liner etching solution.

9. The method of claim 8, wherein the second active region liner layer is comprised of a silicon oxide.

10. The method of claim 7, further comprising heating the trench liner layer in order to impose a tensile strain on the active regions adjacent to the isolation trench.

11. A method of forming a transistor having a gate area spanning two active transistor areas on a first active region separated from a second active region by an isolation structure, the method comprising:
   forming a first active region liner layer on the surface of the semiconductor substrate;
   selectively removing the first active liner layer from the area between the first active region and the second active region;
   selectively etching an isolation trench in the area between the first active region and the second active region;
   forming a trench liner layer on the surface of the semiconductor substrate;
   forming a layer of dielectric material on the semiconductor substrate;
   mechanically removing the dielectric material and trench liner layer from the first active region;
   selectively removing the first active region liner layer from the first active region using a first active region liner etching solution, to which the trench liner layer is comparatively resistant; and
   forming a controllably conductive layer on the surface of the semiconductor substrate;
   selectively removing the controllably conductive layer from the surface of the semiconductor substrate except for the gate area; and
   doping the active transistor areas in the first active region;

wherein the trench liner comprises bis(t-butylamino)-based nitride.

12. The method of claim 11, wherein the first active region liner is primarily comprised of dichlorosilane nitride.

13. The method of claim 11, wherein the trench liner layer exerts tensile strain upon the active regions adjacent to the isolation trench, and further comprising heating the trench liner layer in order to impose the tensile strain on the active regions adjacent to the isolation trench.

14. The method of claim 11, further comprising, prior to forming the first active region liner, forming a second active region liner layer on the active regions that is comparatively resistant to the first active region liner etching solution.

15. The method of claim 14, wherein the second active region liner layer is comprised of a silicon oxide.

16. The method of claim 14, wherein the second active region liner layer is formed by exposing the semiconductor substrate to an oxidative process.

17. A method of forming a transistor having a gate area spanning two active transistor areas on a first active region separated from a second active region by an isolation structure, the method comprising:
    forming a first active region liner layer on the surface of the semiconductor substrate;
    selectively removing the first active liner layer from the area between the first active region and the second active region;
    selectively etching an isolation trench in the area between the first active region and the second active region;
    forming a trench liner layer on the surface of the semiconductor substrate;
    forming a layer of dielectric material on the semiconductor substrate;
    mechanically removing the dielectric material and trench liner layer from the first active region;
    selectively removing the first active region liner layer from the first active region using a first active region liner etching solution, to which the trench liner layer is comparatively resistant; and
    forming a controllably conductive layer on the surface of the semiconductor substrate;
    selectively removing the controllably conductive layer from the surface of the semiconductor substrate except for the gate area; and
    doping the active transistor areas in the first active region;
    further comprising selectively removing the trench liner layer from a portion of the isolation trench adjacent to an active region for PMOS transistors, whereby the tensile strain exerted by the trench liner layer is limited to an active region for NMOS transistors adjacent to the isolation trench.

18. The method of claim 17, further comprising, prior to forming the first active region liner, forming a second active region liner layer on the active regions that is comparatively resistant to the first active region liner etching solution.

19. The method of claim 18, wherein the second active region liner layer is comprised of a silicon oxide.

20. The method of claim 17, further comprising heating the trench liner layer in order to impose a tensile strain on the active regions adjacent to the isolation trench.

* * * * *